US012627290B2

(12) United States Patent
Mühlfeld

(10) Patent No.: US 12,627,290 B2
(45) Date of Patent: May 12, 2026

(54) SWITCHING COMPONENTS

(71) Applicant: Danfoss Silicon Power GmbH,
Flensburg (DE)

(72) Inventor: Ole Mühlfeld, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 531 days.

(21) Appl. No.: 18/004,712

(22) PCT Filed: Jul. 7, 2021

(86) PCT No.: PCT/EP2021/068804
§ 371 (c)(1),
(2) Date: Jan. 9, 2023

(87) PCT Pub. No.: WO2022/017789
PCT Pub. Date: Jan. 27, 2022

(65) Prior Publication Data
US 2023/0253891 A1     Aug. 10, 2023

(30) Foreign Application Priority Data
Jul. 21, 2020    (DE) .................... 10 2020 119 169.3

(51) Int. Cl.
*H03K 17/16*        (2006.01)
*H01L 23/367*       (2006.01)
(Continued)

(52) U.S. Cl.
CPC ........... *H03K 17/12* (2013.01); *H01L 23/367* (2013.01); *H01L 23/49568* (2013.01);
(Continued)

(58) Field of Classification Search
CPC ............ H01L 23/49568; H01L 25/072; H02M 1/088; H02M 7/003; H03K 17/162; H05K 7/14329
See application file for complete search history.

(56) References Cited

U.S. PATENT DOCUMENTS

| | | | |
|---|---|---|---|
| 6,278,199 | B1 | 8/2001 | Grant et al. |
| 9,196,604 | B2 | 11/2015 | Tamada et al. |
| 9,571,086 | B1 | 2/2017 | Romas, Jr. et al. |
| 9,893,646 | B2 | 2/2018 | Rowden et al. |
| (Continued) | | | |

FOREIGN PATENT DOCUMENTS

| | | |
|---|---|---|
| DE | 21 2019 000087 U1 | 1/2020 |
| EP | 2 015 626 A2 | 1/2009 |
| (Continued) | | |

OTHER PUBLICATIONS

International Search Report mailed on Oct. 8, 2021, in connection with International Application No. PCT/EP2021/068804; 4 pages.

*Primary Examiner* — Tucker J Wright
(74) *Attorney, Agent, or Firm* — McCormick, Paulding & Huber PLLC

(57)        ABSTRACT

An apparatus is described having: a baseplate; an AC busbar mounted on the baseplate; a DC busbar having an upper DC busbar, a lower DC busbar and an insulating material therebetween, wherein the DC busbar is mounted such that the lower DC busbar is mounted to the baseplate and wherein the upper DC busbar has one or more openings through which the lower DC busbar is exposed; a first group of switching components mounted on the AC busbar, wherein the first group of switching components are connected to the upper DC busbar using first electrical connection means; and a second group of switching components mounted on the lower DC busbar, wherein at least one of the switching components of said second group of switching components is mounted within one of said openings, (Continued)

wherein the second group of switching components are to the AC busbar using second electrical connection means.

18 Claims, 7 Drawing Sheets

(51) Int. Cl.

| | |
|---|---|
| *H01L 23/495* | (2006.01) |
| *H02M 1/088* | (2006.01) |
| *H02M 7/00* | (2006.01) |
| *H03K 17/12* | (2006.01) |
| *H05K 7/14* | (2006.01) |

(52) U.S. Cl.
CPC .......... *H02M 1/088* (2013.01); *H02M 7/003* (2013.01); *H03K 17/162* (2013.01); *H05K 7/14329* (2022.08)

(56) References Cited

U.S. PATENT DOCUMENTS

| | | | |
|---|---|---|---|
| 10,283,454 B2 | 5/2019 | Traub et al. | |
| 2008/0048342 A1* | 2/2008 | Cheah ..................... | H01L 24/36 |
| | | | 257/777 |
| 2008/0290927 A1* | 11/2008 | Mazzola ........... | H03K 17/6871 |
| | | | 327/424 |
| 2009/0002956 A1* | 1/2009 | Suwa .................... | H02M 7/003 |
| | | | 361/728 |
| 2019/0067160 A1* | 2/2019 | Xu .......................... | H01L 25/18 |
| 2021/0068299 A1 | 3/2021 | Haraguchi | |
| 2021/0098347 A1 | 4/2021 | Hayashiguchi et al. | |

FOREIGN PATENT DOCUMENTS

| | | | |
|---|---|---|---|
| EP | 3 113 223 A1 | 1/2017 | |
| JP | 6305362 B2 | 4/2018 | |
| WO | 2018/007062 A1 | 1/2018 | |
| WO | 2019/131071 A1 | 7/2019 | |

* cited by examiner

SWITCHING COMPONENTS

CROSS-REFERENCE TO RELATED APPLICATIONS

This application is a National Stage application of International Patent Application No. PCT/EP2021/068804, filed on Jul. 7, 2021, which claims priority to German Patent Application No. 10 2020 119 169.3, filed on Jul. 21, 2020, each of which is hereby incorporated by reference in its entirety.

TECHNICAL FIELD

The present specification relates to switching components, such as semiconductor switching components.

BACKGROUND

A semiconductor device may comprise groups of switching elements mounted to a baseplate. Parasitic inductances within the device can give rise to significant induced voltages, particularly as the frequency of switching increases. There remains a need for further developments in this field.

SUMMARY

In a first embodiment, this specification describes an apparatus comprising: a baseplate; an AC busbar mounted on the baseplate; a DC busbar comprising an upper DC busbar, a lower DC busbar and an insulating material therebetween, wherein the DC busbar is mounted such that the lower DC busbar is mounted to the baseplate and wherein the upper DC busbar comprises one or more openings through which the lower DC busbar is exposed; a first group of switching components (e.g. a plurality of switching components) mounted on the AC busbar, wherein the first group of switching components are connected to the upper DC busbar using first electrical connection means (e.g. wirebonds, ribbon bonds, tape bonds, etc.); and a second group of switching components (e.g. a plurality of switching components) mounted on the lower DC busbar, wherein at least one of the switching components of said second group of switching components is mounted within one of said openings, wherein the second group of switching components are connected to the AC busbar using second electrical connection means. The first group of switching components may be unconnected to the lower DC busbar and the second group of switching components may be unconnected to the upper busbar.

In one example embodiment, the at least one of the switching components of said second group of switching components is surrounded by the upper DC busbar on at least three sides. Thus the opening in the upper DC busbar, through which the lower DC busbar is exposed, may fully surround the at least one switching component (by having a continuous presence on all four sides of the switching component) or it may partially surround the switching component (by having, for example, a presence on three of four sides of the switching component).

In one example embodiment, the upper DC busbar is a negative DC busbar, and the lower DC busbar is a positive DC busbar. In an alternative embodiment, the upper DC busbar is a positive DC busbar, and the lower DC busbar is a negative DC busbar.

In some example embodiments, the AC busbar extends on either side of the DC busbar. The AC busbar may, for example, be horseshoe-shaped.

The first group of switching components may be arranged such that an equal number of switching components of the first group are mounted on the AC busbar on each side of the DC busbar. Similarly, the second group of switching components may be arranged such that an equal number of switching components of the second group are connected to the AC busbar on each side of the DC busbar.

Some example embodiments further comprise a control circuit (e.g. in the form of a printed circuit board). The first group of switching components and the second group of switching components may be connected (e.g. using said first and second electrical connection means respectively) to said control circuit. The control circuit may be mounted on the DC busbar (e.g. on the upper DC busbar).

The switching components may be silicon carbide switching components. Many alternatives (such as gallium nitride switching components or other wide bandgap switching components) are also possible.

The apparatus may form a half-bridge circuit, e.g. as part of a power module.

The apparatus may further comprise means for cooling said baseplate.

In a second embodiment, this specification describes a module comprising (at least) any apparatus as described above with reference to the first embodiment. In one example embodiment, the module takes the form of an E3XL package. In the module, the apparatus of the first embodiment may be encapsulated together with a leadframe configured to provide DC and AC terminals.

The module may further comprise a first DC terminal and a second DC terminal provided at one end of the module and an AC terminal provided at the other end of the module, wherein the first and second DC terminal are connected to the upper and lower DC busbars respectively and the AC terminal is connected to the AC busbar.

The module may further comprise means for cooling said baseplate.

In a third embodiment, this specification describes a method of forming an apparatus as described above with reference to the first second aspect or a module (such as a semiconductor power module or a switching module) as described above with reference to the second embodiment. At least some of the apparatus or the module may be formed by additive manufacturing, the method comprising the steps of: providing a computer-readable medium having computer-executable instructions adapted to cause a 3D printer or additive manufacturing apparatus to form the apparatus or module; and forming the apparatus or module using said 3D printer or additive manufacturing apparatus.

In a fourth embodiment, this specification describes a computer-readable medium having computer executable instructions adapted to cause a 3D printer or additive manufacturing apparatus to form some or all of an apparatus as described above with reference to the first aspect or a module as described above with reference to the second embodiment.

BRIEF DESCRIPTION OF THE DRAWINGS

Example embodiments will now be described, by way of example only, with reference to the following schematic drawings, in which.

DETAILED DESCRIPTION

Figure 1:
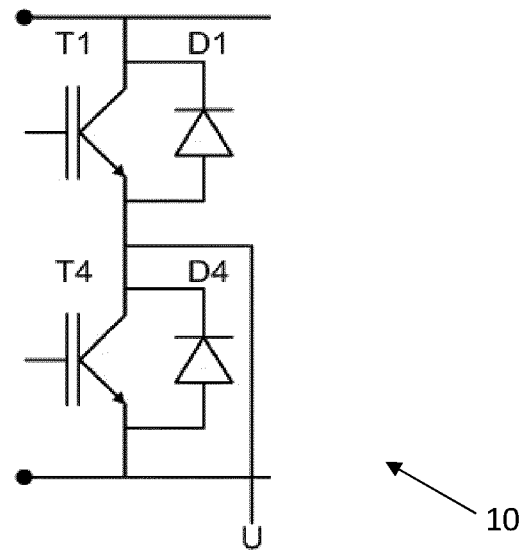
FIG. 1 is a circuit diagram of an example half-bridge switching component.

The scope of protection sought for various embodiments of the invention is set out by the independent claims. The embodiments and features, if any, described in the specification that do not fall under the scope of the independent claims are to be interpreted as examples useful for understanding various embodiments of the invention.

In the description and drawings, like reference numerals refer to like elements throughout.

FIG. 1 is a circuit diagram of an example half-bridge switching component, indicated generally by the reference numeral 10. The half-bridge circuit 10 includes a first transistor T1, a second transistor T4, a first free-wheeling diode D1 and a second free-wheeling diode D4. The half-bridge switching component 10 can be used to selectively connect the output U to either a positive DC voltage supply or a negative DC voltage supply. Thus, the circuit 10 can be used to generate an approximation of an AC output from the DC input.

Figure 2:
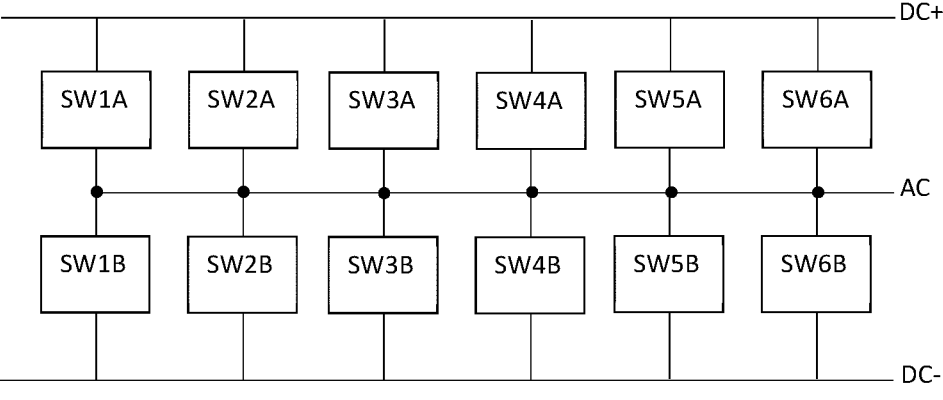
FIG. 2 is a switching module in accordance with an example embodiment.

FIG. 2 is a switching module, indicated generally by the reference numeral 20, in accordance with an example embodiment. The switching module 20 comprises a positive DC input (DC+), a negative DC input (DC−) and an AC output (AC).

The switching module 20 comprises a parallel connection of plurality of first switches connected between the positive DC input and the AC output (six switches SW1A to SW6A are shown in FIG. 2 by way of example) and a parallel connection of plurality of second switches connected between the AC output and the negative DC input (six switches SW1B to SW6B are shown in FIG. 2 by way of example). The switching components in the switching module 20 may be similar to the transistors T1 and T4 described above, but other configurations are possible.

The switching components 10 and 20 may form part of a power module. Power modules are often required to meet two requirements: high power conversion efficiency and high power density. In order to achieve high power density, high performance wide-bandgap semiconductors, such as Silicon Carbide (SiC) or gallium nitride (GaN) semiconductor switches may be used, as they generally outperform standard silicon-based components such as Insulated Gate Bipolar Transistors (IGBTs).

Silicon carbide MOSFETs may be used, for example, in applications where high efficiency is required within a small volume. Silicon carbide MOSFETs can be provided having fast switching speeds and low on-state resistance (Rds.on) at the same time. Silicon carbide wafers are relatively expensive to manufacture, and with current manufacturing processes, it is hard to fabricate components with an acceptably low crystal failure amount; accordingly, silicon carbide die sizes are typically small (for example, 5-25 mm$^2$). Small die sizes keep yield losses low, but restricts the total current that a component can pass. In order to achieve high output powers, several of these small components (for example MOSFETs) need to be operated in parallel (see, for example, the switching module 20 described above). The solutions described herein can be readily adapted to the connection of multiple semiconductors in parallel.

Wide-bandgap devices can place high demands on the design of the power module from thermal and electrical standpoints. The wide-bandgap semiconductors (e.g., SiC or GaN semiconductor switches) can typically be arranged to switch very quickly, e.g. transitioning from conduction to blocking mode in only a few nanoseconds. As current gradients during switching are high, the parasitic inductance of the whole assembly may be required to be low.

Parasitic or stray inductance can be related to current flow within the loop area of a current path of a switching module. One way of reducing the loop area is to ensure that conductors passing a current are placed as close as possible to each other. As discussed in detail below, a busbar arrangement may be provided to meet this requirement. Such busbars can be assembled by simply mounting conductor plates a short distance apart in air. An alternative configuration places a thin film of insulator between the conducting plates, so that the distance apart may be made as thin as the insulation. Such busbars may be made from two or more flat plates which are solidly attached to an insulating film (perhaps by partially melting the insulation whilst the plates are held in the required separation).

Inefficiencies in switching are typically small, but with increasing current requirements, it may still be challenging to keep switching semiconductors within desired working temperature ranges.

Figure 3:
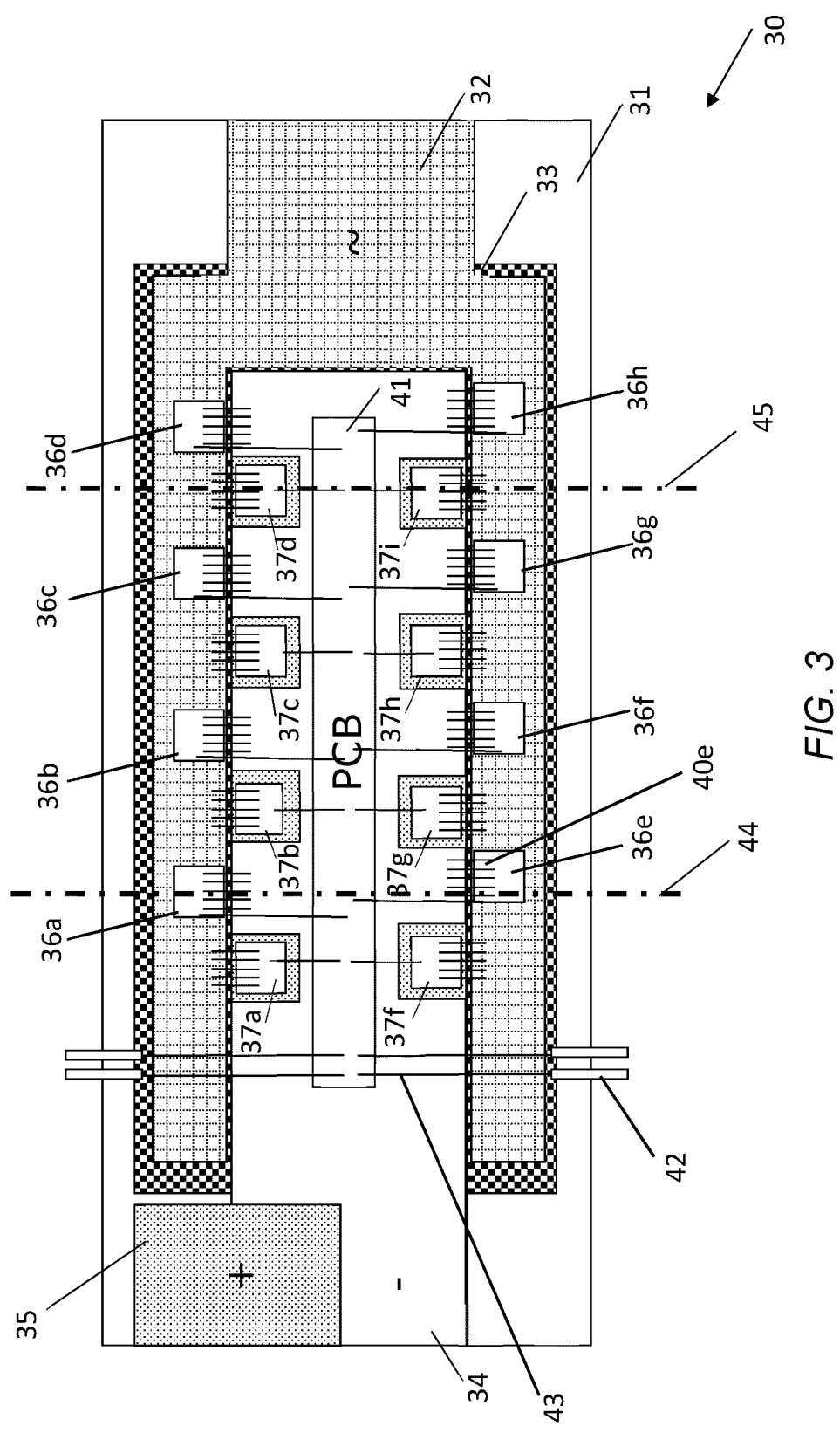
FIG. 3 is a plan view of an example semiconductor component in accordance with an example embodiment.

FIG. 3 is a plan view of an example semiconductor component, indicated generally by the reference numeral 30, in accordance with an example embodiment.

Figure 4:
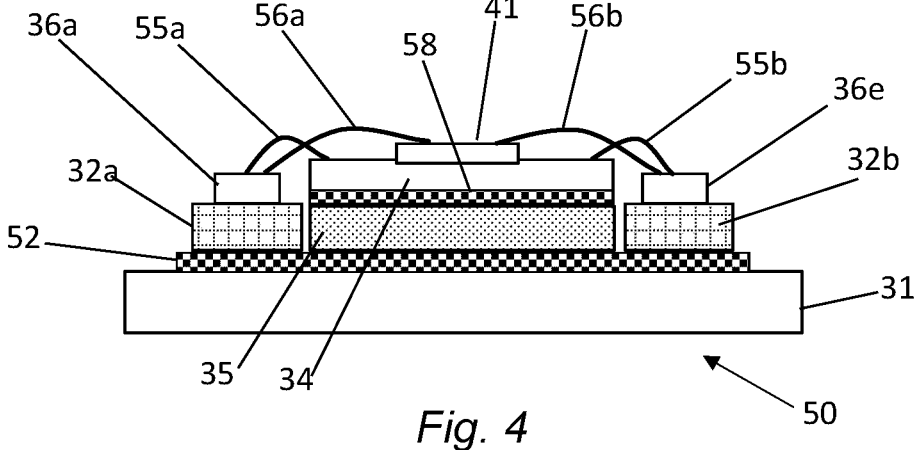
FIG. 4 is a first cross-section of the semiconductor component of FIG. 3 in accordance with an example embodiment.
Figure 5:
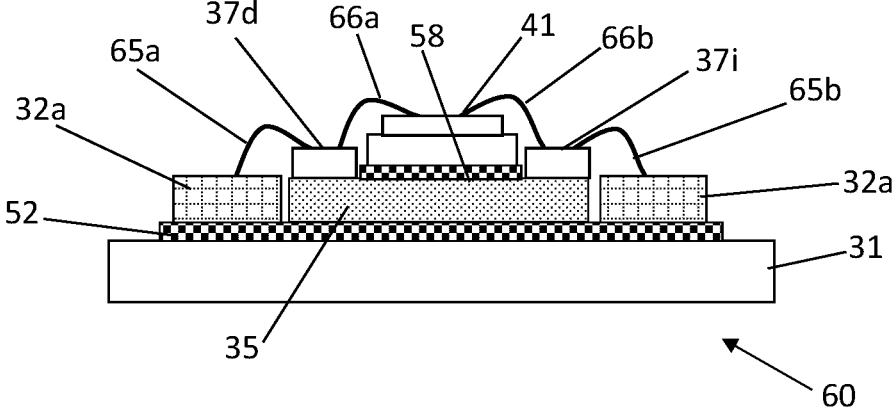
FIG. 5 is a second cross-section of an the semiconductor component of FIG. 3 in accordance with an example embodiment.

FIG. 4 is a first cross-section, indicated generally by the reference numeral 50, of the semiconductor component 30 taken along the line 44 shown in FIG. 3. FIG. 5 is a second cross-section, indicated generally by the reference numeral 60, of the semiconductor component 30 taken along the line 45 shown in FIG. 3.

The semiconductor component 30 comprises a baseplate 31, an AC busbar 32 mounted on the baseplate, and a DC busbar 33 mounted on the baseplate. The DC busbar 33 comprises an upper DC busbar 34, a lower DC busbar 35 and an insulating material 58 therebetween.

The AC busbar 32 may extend on either side of the DC busbar 33. Moreover, as shown in FIG. 3, the AC busbar 32 may have a horseshoe-shape (although this is not essential to all example embodiments).

A first group of switching components 36a, 36b, 36c, 36d, 36e, 36f, 36g and 36h is mounted on the AC busbar 32. As shown in the first cross-section 50, a first example switching component 36a of the first group is electrically connected to the upper DC busbar 34 using wirebond 55a (or some other electrical connection means, such as ribbon bonds, tape bonds etc.). Similarly, a second example switching component 36e of the first group is electrically connected to the upper DC busbar 34 using wirebond 55b (or some other electrical connection means, such as ribbon bonds, tape bonds etc.) The other switching components of the first group are similarly electrically connected to the upper DC busbar 34.

A second group of switching components 37a, 37b, 37c, 37d, 37e, 37f, 37g, 37h, 37i and 37j is mounted on the lower DC busbar 35 (within openings in the upper DC busbar 34). As shown in the second cross-section 60, a first example switching component 37e of the second group is electrically connected to the AC busbar 32 using wirebond 65a (or some other electrical connections means such as ribbon bonds, tape bonds etc.). Similarly, a second example switching component 37j of the second group is electrically connected to the AC busbar 32 using wirebond 65b (or some other electrical connections means such as ribbon bonds, tape bonds etc.). The other switching components of the second group are similarly electrically connected to the AC busbar 32.

Thus, the first group of switching components 36a to 36h provides switching between the upper DC busbar 34 and the AC busbar 32 and the second group of switching components 37a to 37j provide switching between the lower DC busbar 35 and the AC busbar 32. The semiconductor component 30 can therefore be used to implement the switching module 20 described above.

The semiconductor components 30 also comprises a control circuit 41 (such as a printed circuit board), wherein the first group of switching components 36 and the second group of switching components 37 are connected to said control circuit (for example using wirebonds, ribbon bonds or some other electrical connection means). The control circuit 41 may be mounted on the DC busbar (e.g. on the upper DC busbar 34). The control circuit 41 may provide control signals (e.g. gate drive signals) for controlling the switching of the switching components 36 and 37 and may obtain sensor signals (for use in controlling the switching circuits).

As indicated in FIG. 3, the upper DC busbar 34 may be a negative DC busbar and the lower DC busbar 35 may be a positive DC busbar. However, this is not essential to all example embodiments. For example, the upper DC busbar may be a positive DC busbar and the lower DC busbar may be a negative DC busbar.

The switching circuit 30 has a high degree of symmetry. For example, the first group of switching components 36 may be arranged such that an equal number of switching components of the first group are mounted on the AC busbar 32 on each side of the DC busbar 33. Similarly, the second group of switching components 37 may be arranged such that an equal number of switching components of the second group are connected to the AC busbar on each side of the DC busbar. Moreover, the first and second groups may be arranged to have the same number of switching elements (even though this is not the case in the example switching circuit 30).

Such symmetry can have advantages when seeking to synchronise switching, which can be increasingly important as switching speeds increase.

Figure 6:
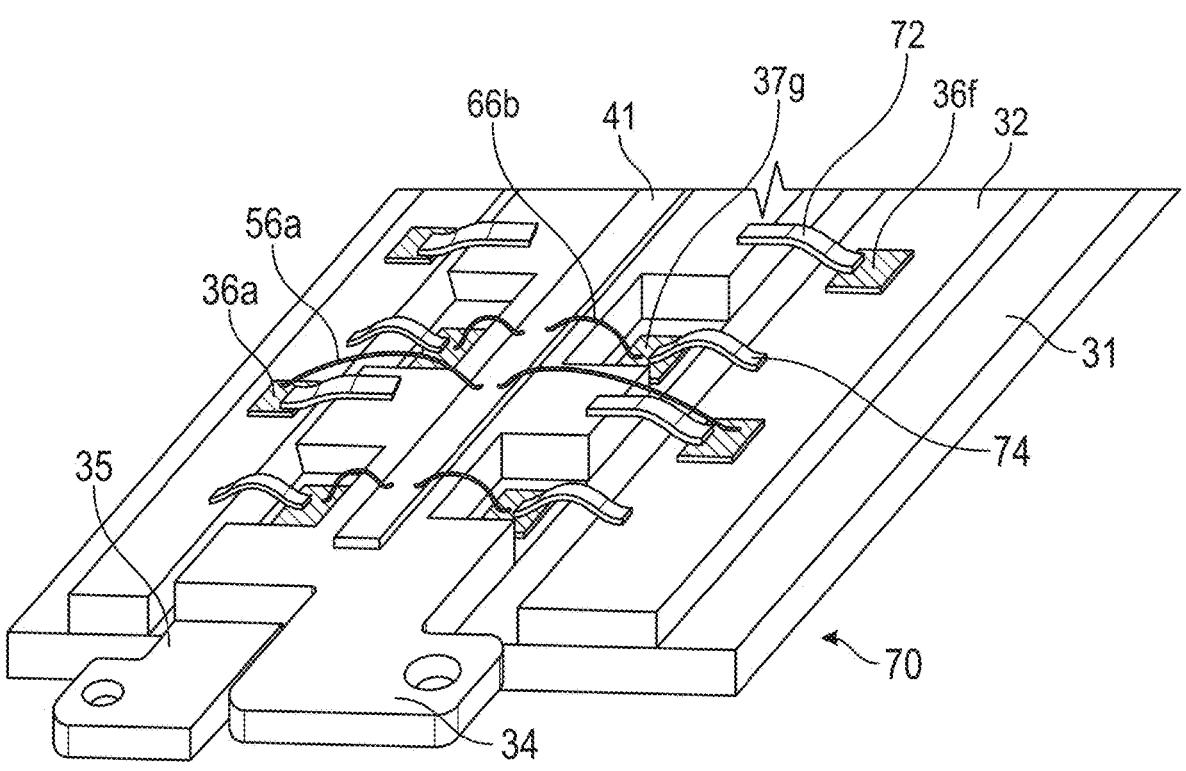
FIG. 6 is a view of part of a semiconductor component in accordance with an example embodiment.

FIG. 6 is a view of part of a semiconductor component, indicated generally by the reference numeral 70, in accordance with an example embodiment.

The semiconductor component 70 includes the AC busbar 32, the upper DC busbar 34 and the lower DC busbar 35 described above, mounted on the baseplate 31.

A first group of switching components is shown mounted to the AC busbar 32, including the switching components 36a and 36f that are labelled in FIG. 6. The switching component 36f is electrically connected to the upper DC busbar 34 using ribbon bond 72 (the other switching components of the first group are similarly connected to the upper DC busbar).

A second group of switching components, including the switching component 37g that is labelled in FIG. 6 is shown mounted on the lower DC busbar 35 (within openings in the upper DC busbar 34). The switching component 37g is electrically connected to the AC busbar 32 using a ribbon bond 74 (the other switching components of the second group are similarly connected to the AC busbar).

The first and second group of switching components are each connected to the control circuit (e.g. printed circuit board) 41. For example, the switching components 36a of the first group is connected to the control circuit 41 using the wirebond 56a.

In order to allow for efficient cooling, it may be an advantage to have small thermal path lengths, since this tends to reduce thermal resistance (Rth). In the switching components 30 and 70 described above, each of the first group of switching components 36a to 36h is mounted on the AC busbar 32 and each of the second group of switching components 37a to 37j is mounted on the lower DC busbar 35 (within openings in the upper DC busbar 34). Thus, all of the switching components are mounted to a conducting plane that is itself mounted to the baseplate 31. Thus, the thermal path from the switching components to the baseplate is short, such that the switching components can be effectively and efficiently cooled.

Figure 7:
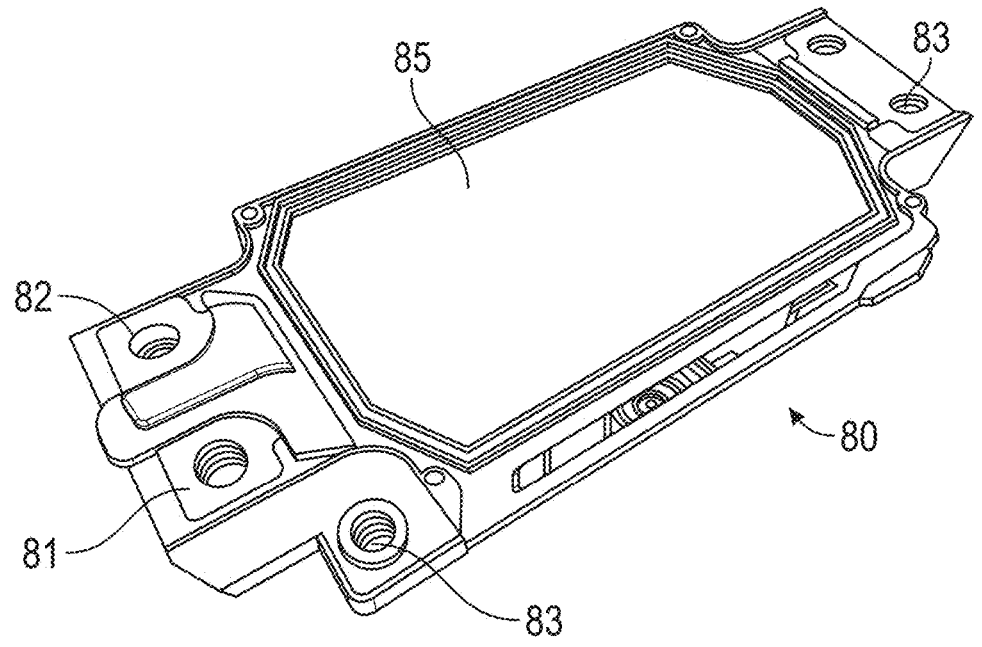
FIG. 7 is a view of a packaged module in accordance with an example embodiment.

FIG. 7 is a view of a packaged module, indicated generally by the reference numeral 80, in accordance with an example embodiment. The module 80 comprises a first DC terminal 81 and a second DC terminal 82 provided at one end of the module and an AC terminal 83 provided at the other end of the module. The DC terminals 81 and 82 may be connected to the upper and lower DC busbars 34 and 35 discussed above and the AC terminal may be connected to the AC busbar 32. The module 80 may, for example, have the form of an E3XL module known in the art. Thus, the functionality described above may be provided in a module having a known form (external size, pinouts etc.).

Figure 8A:
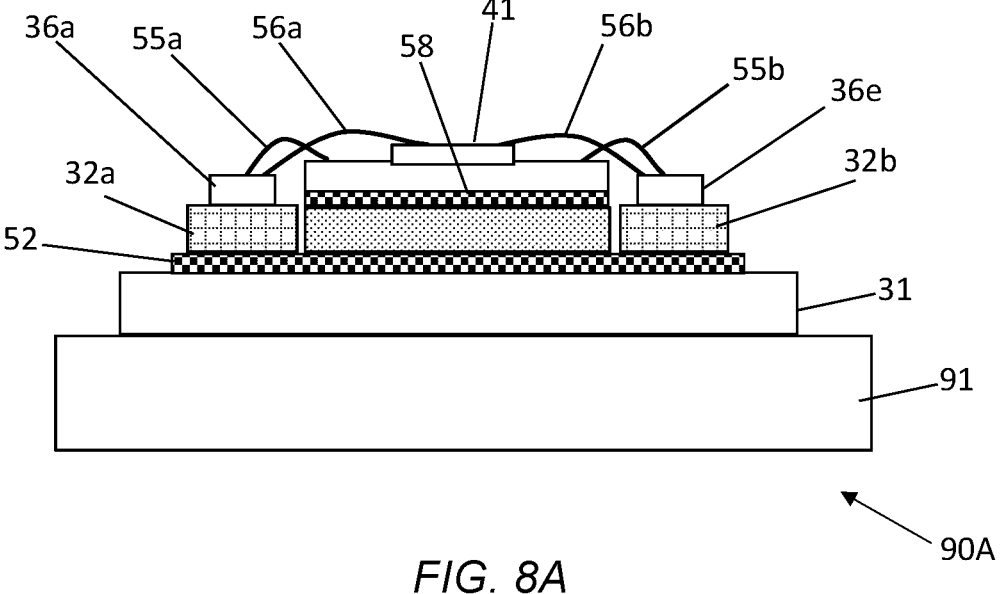
FIGS. 8A and 8B are cross-sections of an example semiconductor components in accordance with example embodiments.
Figure 8B:
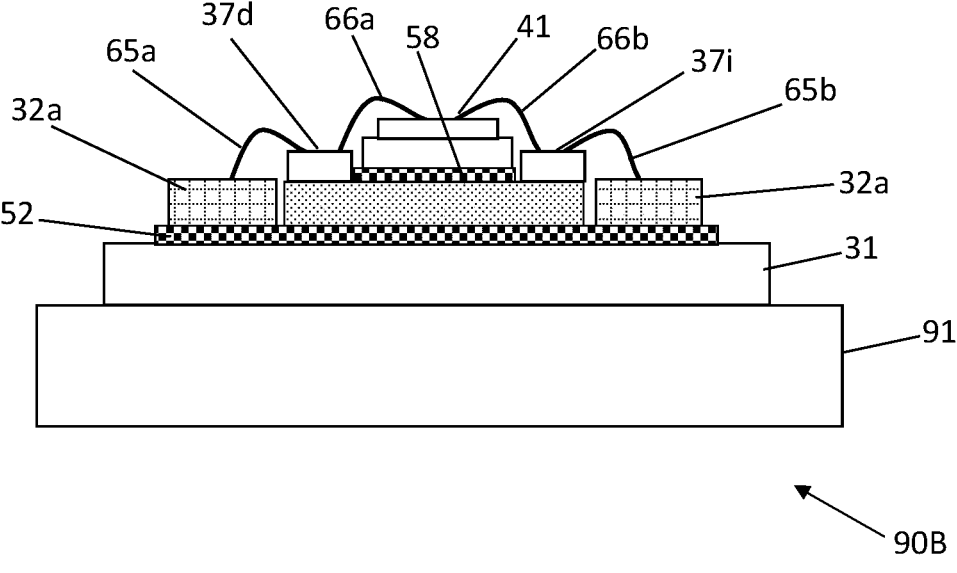

FIGS. 8A and 8B are cross-sections of example semiconductor components, indicated generally by the reference numerals 90A and 90B respectively, in accordance with example embodiments.

The semiconductor component 90A shows the features of the cross-section 50 described above and additionally comprises a cooling means 91 for cooling the baseplate 31. Similarly, the semiconductor components 903 shows the features of the cross-section 60 described above and additionally comprises the cooling means 91. The cooling means 91 may take many forms (such as air cooling or liquid cooling).

The baseplate 31 provides a relatively large thermal mass for cooling elements of the semiconductor components described herein. Further, the cooling means 91 can be provided the side opposite to the busbar and semiconductors switching elements. Since losses in SiC semiconductor switches (for example, SiC Metal-Oxide-Semiconductor Field Effect Transistors (MOSFETs)) tend to reduce if the junction temperature is lower, the provision of the cooling means 91 may further increase power module efficiency. Similar advantages exist when other semiconductor materials are used.

Figure 9:
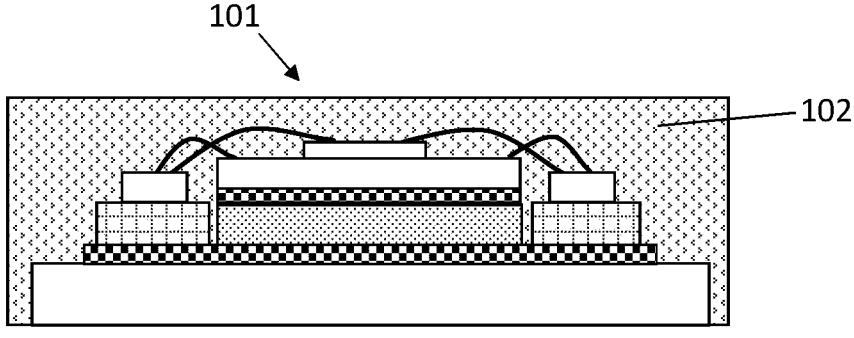
FIG. 9 is a cross-section of an example semiconductor component in accordance with an example embodiment.

FIG. 9 is a cross-section of an example semiconductor component, indicated generally by the reference numeral 100, in accordance with example embodiments. The cross-section 10 includes a switching module 101 similar to the cross-section 50 described above. The semiconductor component 100 is encapsulated together with a leadframe (leadframe elements 102 and 103 are shown) configured to provide the first and second DC terminals and the AC terminal.

The semiconductor component 100 is shown with a base 104 and a lid 105 in a slightly exploded form and is highly schematic. Once assembled, the base 104 and lid 105 are pushed together and an encapsulant provided within. The component 100 provides an alternative package to the module 80 described above.

Figure 10:
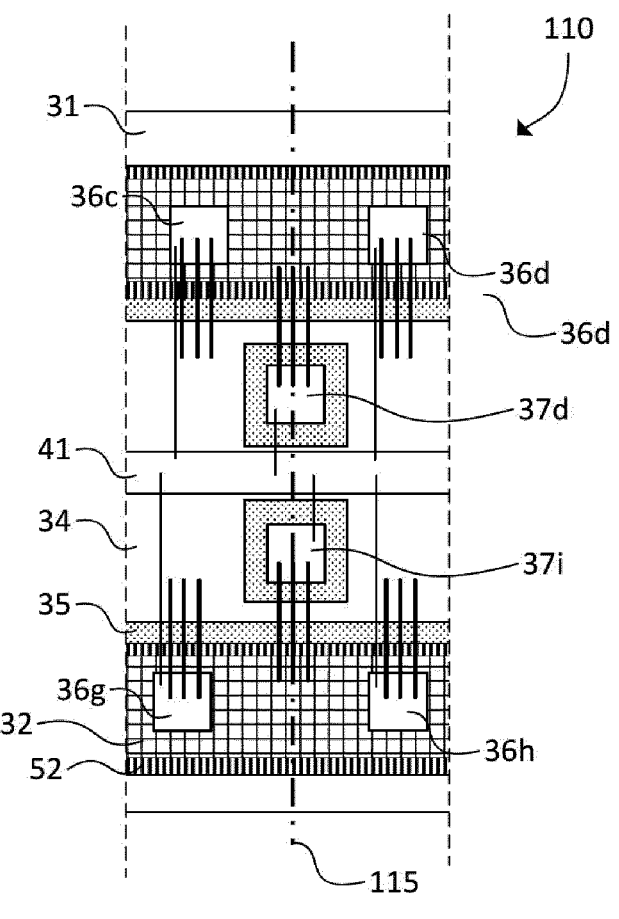
FIG. 10 is a plan view of an example semiconductor component in accordance with a further example embodiment.

FIG. 10 is a plan view of an example semiconductor component, indicated generally by the reference numeral 110, in accordance with a further example embodiment.

This embodiment is similar to the embodiment illustrated in FIG. 3, and the same reference numbers are used again here to refer to features which are substantially the same as those shown in FIG. 3. The main difference between the embodiment shown in FIG. 3. and that shown in FIG. 10 is that the upper DC busbar 34 includes holes which completely surround the switching components 37*d*, 37*i* which are mounted on the lower DC busbar 35.

Figure 11:
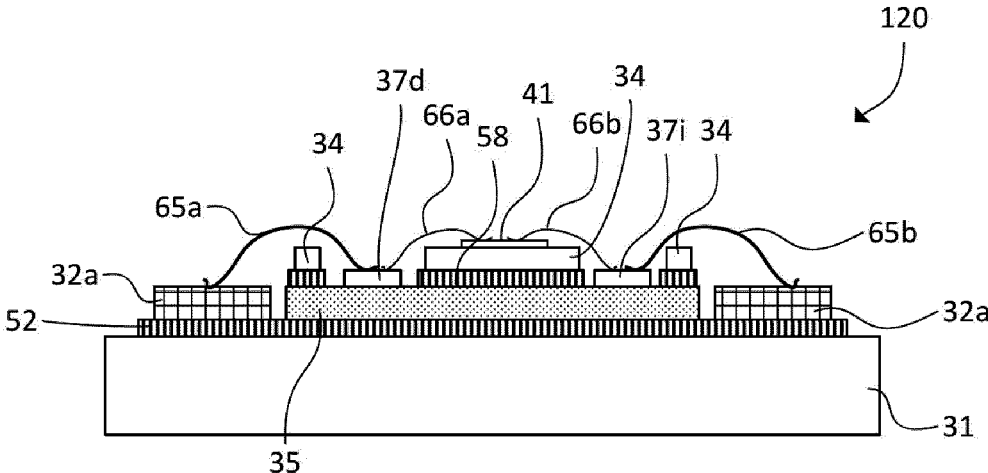
FIG. 11 is a cross-section of the semiconductor component of FIG. 10 in accordance with an example embodiment.

FIG. 11 is a cross-section of the semiconductor component, indicated generally by the reference numeral 120, of the semiconductor component no taken along the line 115 shown in of FIG. 10.

The embodiments of the invention described above are provided by way of example only. The skilled person will be aware of many modifications, changes and substitutions that could be made without departing from the scope of the present invention. The claims of the present application are intended to call all such modifications, changes and substitutions as fall within the spirit and scope of the invention. For example, the principles described herein are applicable to a wide variety of semiconductor components (not just power modules and power module components).

The invention claimed is:

1. An apparatus comprising:
a baseplate;
an AC busbar mounted on the baseplate;
a DC busbar comprising an upper DC busbar, a lower DC busbar and an insulating material therebetween, wherein the DC busbar is mounted such that the lower DC busbar is mounted to the baseplate and wherein the upper DC busbar comprises one or more openings through which the lower DC busbar is exposed;
a first group of switching components mounted on the AC busbar, wherein the first group of switching components are connected to the upper DC busbar using first electrical connection means;
a second group of switching components mounted on the lower DC busbar, wherein at least one of the switching components of said second group of switching components is mounted within one of said openings, wherein the second group of switching components are connected to the AC busbar using second electrical connection means; and
a control circuit;
wherein the first group of switching components comprises a first plurality of switching components and the second group of switching components comprises a second plurality of switching components; and
wherein each of the first plurality of switching components of the first group of switching components and each of the second plurality of switching components of the second group of switching components are connected to the control circuit.

2. The apparatus as claimed in claim 1, wherein the at least one of the switching components of said second group of switching components is surrounded by the upper DC busbar on at least three sides.

3. The apparatus as claimed in claim 1, wherein the upper DC busbar is a negative DC busbar, and the lower DC busbar is a positive DC busbar.

4. The apparatus as claimed in claim 1, wherein the upper DC busbar is a positive DC busbar, and the lower DC busbar is a negative DC busbar.

5. The apparatus as claimed in claim 1, wherein the control circuit is mounted on the DC busbar.

6. The apparatus as claimed in claim 1, wherein the control circuit comprises a printed circuit board.

7. The apparatus as claimed in claim 1, wherein the switching components are silicon carbide switching components.

8. The apparatus as claimed in claim 1, wherein the apparatus forms a half-bridge circuit.

9. A module comprising the apparatus as claimed in claim 1.

10. The module as claimed in claim 9, further comprising a first DC terminal and a second DC terminal provided at one end of the module and an AC terminal provided at the other end of the module, wherein the first and second DC terminal are connected to the upper and lower DC busbars respectively and the AC terminal is connected to the AC busbar.

11. The module as claimed in claim 9, wherein the apparatus is encapsulated together with a leadframe configured to provide DC and AC terminals.

12. The module as claimed in claim 9, further comprising means for cooling said baseplate.

13. The apparatus as claimed in claim 1, further comprising means for cooling said baseplate.

14. An apparatus comprising:
a baseplate;
an AC busbar mounted on the baseplate;
a DC busbar comprising an upper DC busbar, a lower DC busbar and an insulating material therebetween, wherein the DC busbar is mounted such that the lower DC busbar is mounted to the baseplate and wherein the upper DC busbar comprises one or more openings through which the lower DC busbar is exposed;
a first group of switching components mounted on the AC busbar, wherein the first group of switching components are connected to the upper DC busbar using first electrical connection means; and
a second group of switching components mounted on the lower DC busbar, wherein at least one of the switching components of said second group of switching components is mounted within one of said openings, wherein the second group of switching components are connected to the AC busbar using second electrical connection means;
wherein the AC busbar extends on either side of the DC busbar.

15. The apparatus as claimed in claim 14, wherein the first group of switching components are arranged such that an equal number of switching components of the first group are mounted on the AC busbar on each side of the DC busbar.

16. The apparatus as claimed in claim 14, wherein the second group of switching components are arranged such that an equal number of switching components of the second group are connected to the AC busbar on each side of the DC busbar.

17. The apparatus as claimed in claim 14, wherein the AC busbar is horseshoe-shaped.

18. An apparatus comprising:

a baseplate;

an AC busbar mounted on the baseplate;

a DC busbar comprising an upper DC busbar, a lower DC busbar and an insulating material therebetween, wherein the DC busbar is mounted such that the lower DC busbar is mounted to the baseplate and wherein the upper DC busbar comprises one or more openings through which the lower DC busbar is exposed;

a first group of switching components mounted on the AC busbar, wherein the first group of switching components are connected to the upper DC busbar using first electrical connection means; and a second group of switching components mounted on the lower DC busbar, wherein at least one of the switching components of said second group of switching components is mounted within one of said openings, wherein the second group of switching components are connected to the AC busbar using second electrical connection means;

wherein the AC busbar extends on opposite sides of the DC busbar;

wherein the first group of switching components comprises a first plurality of switching components and a second plurality of switching components; and wherein the first plurality of switching components of the first group of switching components is arranged on one side of the opposite sides and the second plurality of switching components of the first group of switching components is arranged on the other side of the opposite sides.

* * * * *